(12) United States Patent
Tanaka

(10) Patent No.: US 6,788,390 B2
(45) Date of Patent: Sep. 7, 2004

(54) LIGHT RECEIVING APPARATUS, MARK DETECTING APPARATUS USING LIGHT RECEIVING APPARATUS, EXPOSING APPARATUS, MAINTENANCE METHOD OF EXPOSING APPARATUS, MANUFACTURING METHOD OF SEMICONDUCTOR DEVICE USING EXPOSING APPARATUS AND SEMICONDUCTOR MANUFACTURING PLANT

(75) Inventor: Hiroshi Tanaka, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 280 days.

(21) Appl. No.: 09/922,848

(22) Filed: Aug. 7, 2001

(65) Prior Publication Data

US 2002/0036777 A1 Mar. 28, 2002

(30) Foreign Application Priority Data

Aug. 8, 2000 (JP) .................................... 2000/239425

(51) Int. Cl.$^7$ ............................ G03B 27/72; G01J 1/32
(52) U.S. Cl. .................................. 355/68; 250/205
(58) Field of Search ................................. 250/205, 234, 250/208.1; 355/53, 67, 68, 69

(56) References Cited

U.S. PATENT DOCUMENTS

| | | | |
|---|---|---|---|
| 5,141,321 A | | 8/1992 | Tsuruoka .................... 356/400 |
| 5,191,374 A | * | 3/1993 | Hazama et al. ............... 355/43 |
| 5,347,118 A | | 9/1994 | Iwanaga ..................... 250/205 |
| 5,473,412 A | * | 12/1995 | Ozawa ........................ 355/77 |
| 5,567,928 A | * | 10/1996 | Sano .......................... 250/205 |
| 6,496,247 B2 | * | 12/2002 | Suzuki ........................ 355/67 |

FOREIGN PATENT DOCUMENTS

| | | |
|---|---|---|
| JP | 03-226187 | 10/1991 |
| JP | 05-190421 | 7/1993 |

* cited by examiner

Primary Examiner—Alan Mathews
(74) Attorney, Agent, or Firm—Fitzpatrick, Cella, Harper & Scinto

(57) ABSTRACT

A light receiving apparatus, a mark detecting apparatus or the like, which can generate an image with high accuracy without changing oscillation frequency of an oscillating unit, permit increased accuracy of measurement and reduction of measurement time and contribute to improvement of throughput, include a unit for obtaining storage time when light is received by a CCD camera 8 which is a storage-type position sensor and pulse light emitting frequency of a pulse light emitting apparatus 14 from a cycle of the oscillating unit 7 and predetermined number of pulses of the pulse light emitted from the pulse light emitting apparatus 14 to start storage of the CCD camera 8 and emit the pulse light from the pulse light emitting apparatus 14 by the obtained pulse light emitting frequency.

13 Claims, 12 Drawing Sheets

FIG. 8

| URL | http://www.maintain.co.jp/db/input.html |

TROUBLE DB INPUT SCREEN

DATE OF OCCURRENCE [ 2000/3/15 ] ~404
MODEL [ ********** ] ~401
SUBJECT [ MALFUNCTION (START-UP ERROR) ] ~403
APPARATUS S/N [ 465NS4580001 ] ~402
URGENCY [ D ] ~405
SYMPTOM [ LED CONTINUES FLASHING AFTER POWER-UP ] ~406
REMEDY [ REPOWER-UP (PUSH DOWN RED BUTTON AT START-UP) ] ~407
PROGRESS [ TENTATIVELY HANDLED ] ~408

[SEND] [RESET]      410           411           412
LINK TO DATABASE OF LIST OF RESULTS  SOFTWARE LIBRARY  OPERATION GUIDE

MANUFACTURE FLOW OF SEMICONDUCTOR DEVICE

WAFER PROCESS

LIGHT RECEIVING APPARATUS, MARK DETECTING APPARATUS USING LIGHT RECEIVING APPARATUS, EXPOSING APPARATUS, MAINTENANCE METHOD OF EXPOSING APPARATUS, MANUFACTURING METHOD OF SEMICONDUCTOR DEVICE USING EXPOSING APPARATUS AND SEMICONDUCTOR MANUFACTURING PLANT

FIELD OF THE INVENTION

The present invention relates to a light receiving apparatus which is an image capturing apparatus which uses pulse light such as a pulsed laser as illumination light, mark detecting apparatus using the light receiving apparatus, exposing apparatus, maintenance method of exposing apparatus, manufacturing method of semiconductor device using exposing apparatus and semiconductor manufacturing plant.

BACKGROUND OF THE INVENTION

In a semiconductor manufacturing apparatus (such as an exposing apparatus) which manufactures a memory with high density or a CPU with high specification, required exposure resolution is not more than 0.20 [$\mu$m]. Thus, in order to transfer a finer pattern, a KrF laser (248 [nm]), an ArF laser (193 [nm]) and further an $F_2$ laser (157 [nm]) are used as exposure light sources.

As part of a positioning method of the semiconductor manufacturing apparatus, there is a need for accurately measuring a positional relationship between a reticle which is an original plate or a reticle stage (original plate stage) on which the reticle is set and a wafer stage (substrate stage). The most advantageous measuring method thereof is TTR measurement for simultaneously measuring the reticle and stage. The TTR measurement is measurement carried out via a projection lens located between the reticle and stage. For an illumination light source used in the TTR measurement, exposure light is the most suitable. The reason is that aberration of the projection lens (such as chromatic aberration) is adjusted to the exposure light, which allows the reticle and stage to be simultaneously measured.

Presently, a main illumination apparatus which can emit light with high energy and short wavelength is an apparatus with an excimer laser or the like as a light source. Such a laser is a pulse light emitting laser (pulse light emitting apparatus).

An image capturing apparatus of a pulsed laser is disclosed in Japanese Patent Laid-Open Nos. 3-226187 and 5-190421, and the apparatuses disclosed in the specifications use the following four methods to generate images with reduced illumination non-uniformity.

(1) The illumination non-uniformity of the laser is restrained by oscillating means in an illumination apparatus.
(2) The laser is synchronized with a picture synchronizing signal input in the image capturing apparatus and is controlled to have the same number of pulses during light storage.
(3) In order to reduce the illumination non-uniformity, captured electrical signals are integrated.
(4) A cycle of the oscillating means is synchronized with the cycle of image capture.

FIG. 11 is a schematic view of a configuration of a light receiving apparatus according to a conventional example. Light of a pulse laser (Laser) 14 which is a pulse light emitting apparatus is leveled (uniformed) by oscillating means 7 such as a wedge, and after passing through mirrors 4, 5 and a half mirror 6, illuminates a mark of a wafer 3 on a substrate stage via a projection lens 2. After passing through the mirror 5 and half mirror 6 via the projection lens 2, the reflected light from the mark an image is imaged by a CCD camera (cam) 8 which is a storage-type position sensor. A synchronizing signal of the CCD camera 8 is generated by a synchronizing signal generator (Sync) 15. At the same time, the synchronizing signal is sent to the oscillating means 7 and laser (Laser) 14 to synchronize the CCD camera 8, oscillating means 7 and laser 14.

In FIG. 11, reference numeral 1 denotes a reticle; 9, driving means (motor); 10, an interferometer (inter); 11, a stage control apparatus (SF); and 12, an exposure control apparatus (com). Further, reference numeral 13 denotes a oscillating control apparatus (IS Cont); 16, an A/D converter; and 18, a control section for an image processing apparatus.

The CCD camera 8, which is of an NTSC system, stores light divided between even/odd timing, and as shown in FIG. 12, an oscillating cycle is adjusted to a cycle corresponding to an integral multiple of even/odd fields. FIG. 12 is an explanatory view of timing of the oscillating means, laser light emitting and image storing according to the conventional example.

In the conventional example, stored image data are added by an adder (sum) 17 shown in FIG. 11, and in FIG. 12, images of three or six frames are combined to generate images for measurement.

However, scan exposure has come to be carried out, which has caused the need for synchronizing the oscillating means with a scanning speed. That is, in the scan exposure, a resist on the wafer is irradiated with the light of the pulse laser as if a slit scanned over the wafer (substrate). In order to carry out exposure without illumination non-uniformity within a scanning area, exposure must be carried out in such a manner that a certain point on the wafer is irradiated with pulse light for one cycle or n cycles (n: natural number) of the oscillating means in a time period during which the point moves across the width of the slit. Thus, an increased scanning speed requires increased oscillation frequency of the oscillating means. The scanning speed is inversely proportional to energy for exposing the resist on the wafer, and an increased amount of exposure requires increased number of laser pulses (energy). Oscillation frequency of the laser is fixed (generally largest), so that a reduced scanning speed controls the oscillation frequency of the laser. In this way, for accommodating the scan exposure, the oscillating means must change an oscillation amount (oscillation frequency) in accordance with the scanning speed (exposure amount).

In case of storing the pulse light by the CCD camera of the NTSC system, the exposure time is limited to $\frac{1}{60}$ second. When the storage time is limited, oscillation by the oscillating means must be adjusted to an integral multiple of $\frac{1}{60}$ second in order not to produce illumination non-uniformity and not to cause even/odd difference at any time in imaging by an interlace system with even/odd time division specific to the NTSC system.

There is an optimum oscillation frequency requested in according with terms of the scanning speed, while the oscillation frequency must be adjusted separately in accordance with terms of the measurement, and each measurement requires control of the oscillating means. Generally, for changing in a short time an operation speed of an object moving at a high speed, control time for about a few second is required under the influence of inertia. In order to reduce the time to a few milliseconds, control means with high performance must be used. For this purpose, there is also a configuration which has oscillating means dedicated to measurement separately from the oscillating means for scanning.

However, the problem of the configuration is that the size of the illumination apparatus is increased and that double optical members for forming each oscillating means are required. Further, part of the light emitted from the light source must be directed to an optical system dedicated to measurement, which reduces illumination intensity for pattern exposure. Accordingly, the optimum configuration is such that part of an illumination system of a scan exposure system is utilized without making a dedicated optical system.

The TTR measurement is a measuring system which is used in calibration of a stage position and reticle position, calibration of a projection lens, or the like, and the measurement is carried out using wafer replacement time or the like. However, a recent exposing apparatus has the shortest wafer replacement time to increase throughput (wafer processing capacity per unit of time). In the measurement carried out in the wafer replacement, dead time of the apparatus is used until the oscillating means is stabilized.

The conventional system has a problem that the oscillating means must be controlled for image capture for measurement, which has influence on the throughput of the apparatus. When using in the image capturing apparatus a camera of the type that light storage divided between even/odd fields such as the NTSC system is carried out, difference in brightness (difference in illumination intensity) occurs between even/odd fields switched per 16.6 [msec] (=1/60 sec). The following items are the causes of occurrence of the difference in the illumination intensity.

(1) The difference in the illumination intensity occurs under the influence of variation of laser energy in 16.6 [msec]. Especially, an amount of laser energy for a first pulse is relatively high and the amount is transitionally stabilized.
(2) The difference in the illumination intensity occurs by non-uniformity of the oscillation frequency of the oscillating means.

Harmful influence of the occurrence of the difference in the illumination intensity is poor accuracy of measurement of the captured image. For example, in measurement for quantifying a defocus amount by contrast of captured signals, accurate measurement cannot be achieved without constant amount of light. This is because the contrast value is varied by brightness.

Thus, reduction of the difference in the illumination intensity is required for improvement of the measurement accuracy. For this purpose, there are conventional methods including a method for increasing time (number of time) for integrating captured electrical signals and a method of discarding an image first captured by a camera. However, these methods have problems of requiring much time to capture images.

Another method is such that starting points of a capture start and the oscillating means are synchronized for each even/odd field. This method has disadvantage of increased time to capture images and also of complicated control of the oscillating means and capture.

Another problem of time-series capture of the even/odd fields is that all picture elements are not stored at the same time. A reticle stage and wafer stage are synchronously controlled, but when a first position of 1/60 [sec] is different from a latter position of 1/60 [sec], leveled light storage is not carried out but the images are changed in a stepping manner.

As a summary of the above descriptions, the prior art has the problems as described below.

(1) The oscillating means cannot be adjusted to the cycle of the image capture time in a short time. Adjustment over a long time has influence on the throughput.
(2) Capturing the image by the NTSC system causes non-uniformity of amounts of illumination light between even/odd fields, which has influence on the measurement accuracy.
(3) Capturing the image by the NTSC system has no synchronism between even/odd time-division images, so that occurrence of fine positional change prevents generation of integrated signals.

SUMMARY OF THE INVENTION

The present invention has been proposed to solve the conventional problems, and has as its object to provide a light receiving apparatus, mark detecting apparatus, exposing apparatus, manufacturing method of semiconductor device or the like, which can generate an image with high accuracy without changing oscillation frequency of oscillating means, permit increased accuracy in measurement, reduce measurement time and contribute to improvement of throughput.

In order to solve the above problems, the light receiving apparatus, mark detecting apparatus, exposing apparatus or the like according to the present invention have the following configurations.

A light receiving apparatus according to the present invention for uniforming pulse light emitted from a pulse light emitting apparatus by oscillating means and receiving the light by a storage-type position sensor may include means for obtaining pulse light emitting frequency of the pulse light emitting apparatus from a cycle of the oscillating means and predetermined number of pulses of the pulse light to start storage by the storage-type position sensor and emit the pulse light from the pulse light emitting apparatus by the obtained pulse light emitting frequency.

In the light receiving apparatus according to the present invention, the storage-type position sensor may preferably use a non-interlace type CCD camera which can control the storage time when the light is received by the storage-type position sensor.

In the light receiving apparatus according to the present invention, the storage-type position sensor may preferably use an interlace type CCD camera which can control even/odd (even field/odd field) storage time when the light is received by the storage-type position sensor.

In the light receiving apparatus according to the present invention, the storage time when the light is received by the storage-type position sensor may preferably start earlier than a pulse light emitting start and end later than a pulse light emitting end.

In the light receiving apparatus according to the present invention, the pulse light emitting apparatus may preferably use an excimer laser.

In the light receiving apparatus according to the present invention, the pulse light emitting apparatus may be preferably controlled by two steps of a dummy pulse light emitting step and a measurement pulse light emitting step, the storage by the storage-type position sensor being not carried out by the dummy pulse light emitting, but by the measurement pulse light emitting, the storage time of the storage-type position sensor and the pulse light emitting frequency being obtained from the cycle of the oscillating means and the predetermined number of pulses to start the storage by the storage-type position sensor and emit the pulse light from the pulse light emitting apparatus by the obtained pulse light emitting frequency.

In the light receiving apparatus according to the present invention, the storage start of the storage-type position sensor and the pulse light emitting from the pulse light emitting apparatus by the obtained pulse light emitting frequency may be preferably carried out simultaneously.

In the light receiving apparatus according to the present invention, the oscillating cycle of the oscillating means may be preferably adjusted to the pulse light emitting frequency by adjusting the oscillation frequency of the oscillating means to the storage time of the storage-type position sensor, there being no need for adjusting the oscillating means to an image capture cycle by the light receiving apparatus.

In the light receiving apparatus according to the present invention, there may be preferably no need for adjusting the oscillating means to measurement, permitting use of the oscillation frequency of the oscillating means in exposure.

In the light receiving apparatus according to the present invention, there may be preferably no need for synchronizing a staring point of the oscillating means with the storage start of the storage-type position sensor, controlling the storage time of the storage-type position sensor corresponding to an amount of the pulse light required for the measurement of a mark position or the like.

In the light receiving apparatus according to the present invention, the pulse light of a few pulses may be preferably first emitted to wait stabilization of energy of the pulse light and then start the storage by the storage-type position sensor for emitting light of required pulses.

A mark detecting apparatus according to the present invention may include a light receiving apparatus, a mark on a substrate being irradiated with the pulse light which is uniformed by the oscillating means and output by the pulse light emitting apparatus, reflected light from the mark being received by the storage-type position sensor to detect the mark.

The mark detecting apparatus according to the present invention may preferably measure an amount of light of the mark by the mark.

The mark detecting apparatus according to the present invention may preferably measure contrast of the mark by the mark.

The mark detecting apparatus according to the present invention may preferably measure a position of the mark by the mark.

An exposing apparatus according to the present invention for projecting a pattern on an original plate stage on a substrate of a substrate stage via a projection lens may detect one or both of a positioning mark on the original plate stage and a positioning mark on the substrate stage using the mark detecting apparatus.

An exposing apparatus according to the present invention for projecting a pattern on an original plate stage on a substrate of a substrate stage via a projection lens may detect one or both of a contrast measurement mark on the original plate stage and a contrast measurement mark on the substrate stage using the mark detecting apparatus.

A manufacturing method of a semiconductor device according to the present invention may include steps of:

locating a plurality of semiconductor manufacturing apparatuses including an exposing device in a plant; and manufacturing the semiconductor device using the plurality of semiconductor manufacturing apparatuses.

The manufacturing method of the semiconductor device according to the present invention may preferably further include steps of:

connecting the plurality of semiconductor manufacturing apparatuses with a local area network;

connecting the local area network with an external network outside the semiconductor manufacturing plant;

obtaining information on the exposing apparatus from database on the external network using the local area network and the external network; and controlling the exposing apparatus based on the obtained information.

The manufacturing method of the semiconductor device according to the present invention may preferably obtain maintenance information of the manufacturing apparatus through data communication by having access to database provided by a vendor or user of the exposing apparatus via the external network, or carry out production management through data communication with a semiconductor manufacturing plant different from the above described semiconductor manufacturing plant via the external network.

A semiconductor manufacturing plant according to the present invention may include:

a plurality of semiconductor manufacturing apparatuses including an exposing apparatus;

a local area network for connecting the plurality of semiconductor manufacturing apparatuses; and a gateway for connecting the local area network with an external network outside the semiconductor manufacturing plant, permitting data communication of information on at least one of the plurality of semiconductor manufacturing apparatuses.

A maintenance method of an exposing apparatus may include steps of:

preparing database which stores information on maintenance of the exposing apparatus on an external network outside a plant where the exposing apparatus is located;

connecting the exposing apparatus with a local area network in the plant; and maintaining the exposing apparatus based on the information stored in the database using the external network and the local area network.

The exposing apparatus according to the present invention may preferably include a display, a network interface and a computer for executing software for network, permitting data communication of the maintenance information of the exposing apparatus via a computer network.

In the exposing apparatus according to the present invention, the software for network may preferably provide a user interface on the display which is connected to the external network outside the plant where the exposing apparatus is located and for having access to the maintenance database provided by the vendor or user of the exposing apparatus, permitting obtaining information from the database via the external network.

Image capture (such as a light receiving apparatus or mark detecting apparatus) synchronizes the image storage time with the oscillation frequency of the oscillating means. Then, the number of laser pulses for the image storage are always kept constant and the images with the same amount of light are always generated from the above number of laser pulses at any oscillation frequency (storage time). For that purpose, laser light emitting frequency and the storage time of the CCD camera are calculated from the oscillation frequency and the number of laser light emitting pulses, and the number of laser light emitting pulses and the laser light emitting frequency are set in the laser and the storage time is set in the CCD camera. The image is picked up by simultaneously starting laser light emitting and light storage by the CCD camera asynchronously with the oscillating means.

The most desirable image storage is storage by a non-interlace system for simultaneously storing all the picture elements rather than storing by even/odd time-series division. Timely changing differences in the illumination intensity are leveled and stored in all the picture elements on the stored image, so that no difference between even/odd fields occurs. The uniformity of the oscillating means not only has influence on all the picture elements on an average but also extremely increases brightness of the whole screen obtained for each capture and reproducibility of the uniformity. Even/odd storage also becomes effective by exposure time adjusted to the oscillation frequency rather than 1/60 [sec] which is defined by a standard of the NTSC system. Further, there is no need for synchronizing the starting point of the oscillating means with the storing start, which permits providing a simplified system.

Adjusting the storage time to the oscillation frequency and adjusting the oscillating cycle to the laser light emitting (pulse) frequency so as to always store the pulse light of the same number permit stable image capture without change of brightness for each capture to improve measurement accuracy.

Further, by using a non-interlace camera, each of the pulsed laser light spreads through all the picture elements of the storage type image sensor, eliminating the difference in the illumination intensity. Further, the light spreading through all the picture elements is the light captured at the same time, so that no time error occurs with the measurement signal. The time error means shift of images which occurs due to difference between even/odd capture time.

Sensor storage time only may be controlled which corresponds to the laser oscillating time until reaching the amount of light (of the pulse light) required for measurement (of a mark position or the like). Thus, integration of the electrical signals is unnecessary. Moreover, there is no need for adjusting the oscillating means to the image capture cycle, which eliminates the need for increasing accuracy of the oscillating means.

Of course, there is no need for adjusting the oscillating means to the measurement, so that the oscillation frequency in exposure can be used to eliminate a stop condition of the apparatus due to the change of the frequency. Consequently, driving efficiency of the apparatus is increased and the throughput is improved compared to the conventional examples.

This system can contribute to improvement of both of the measurement accuracy and the throughput.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 8 is a view of a detailed example of an user interface in the production system of the semiconductor device including the exposing apparatus according to the present invention;

DETAILED DESCRIPTION OF THE PREFERRED EMBODIMENTS

Preferred embodiments of the present invention will now be described in detail in accordance with the accompanying drawings.

Embodiments of the present invention will be described below in detail with reference to the drawings.

[First Embodiment]

Figure 1:
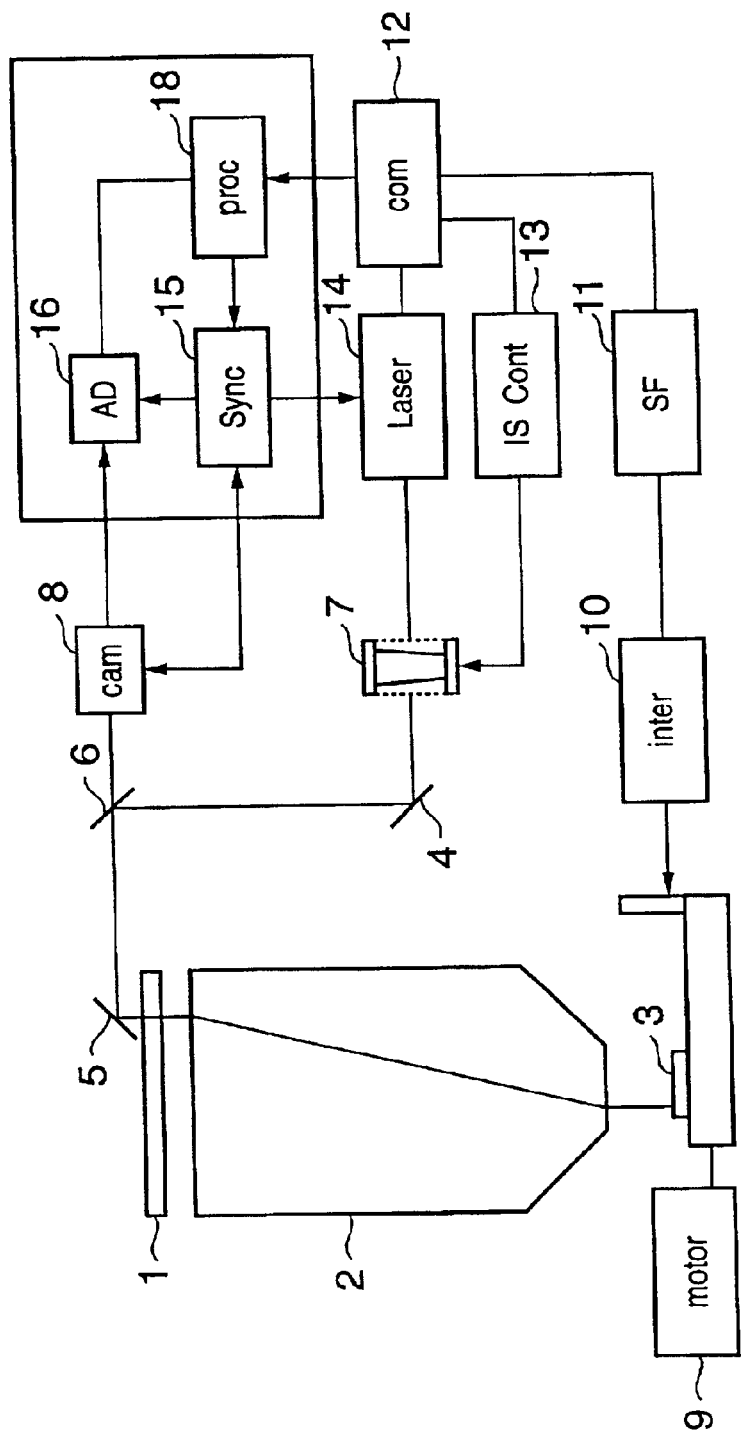
FIG. 1 is a schematic view of configurations of a light receiving apparatus and a mark detecting apparatus according to the present invention.
Figure 11:
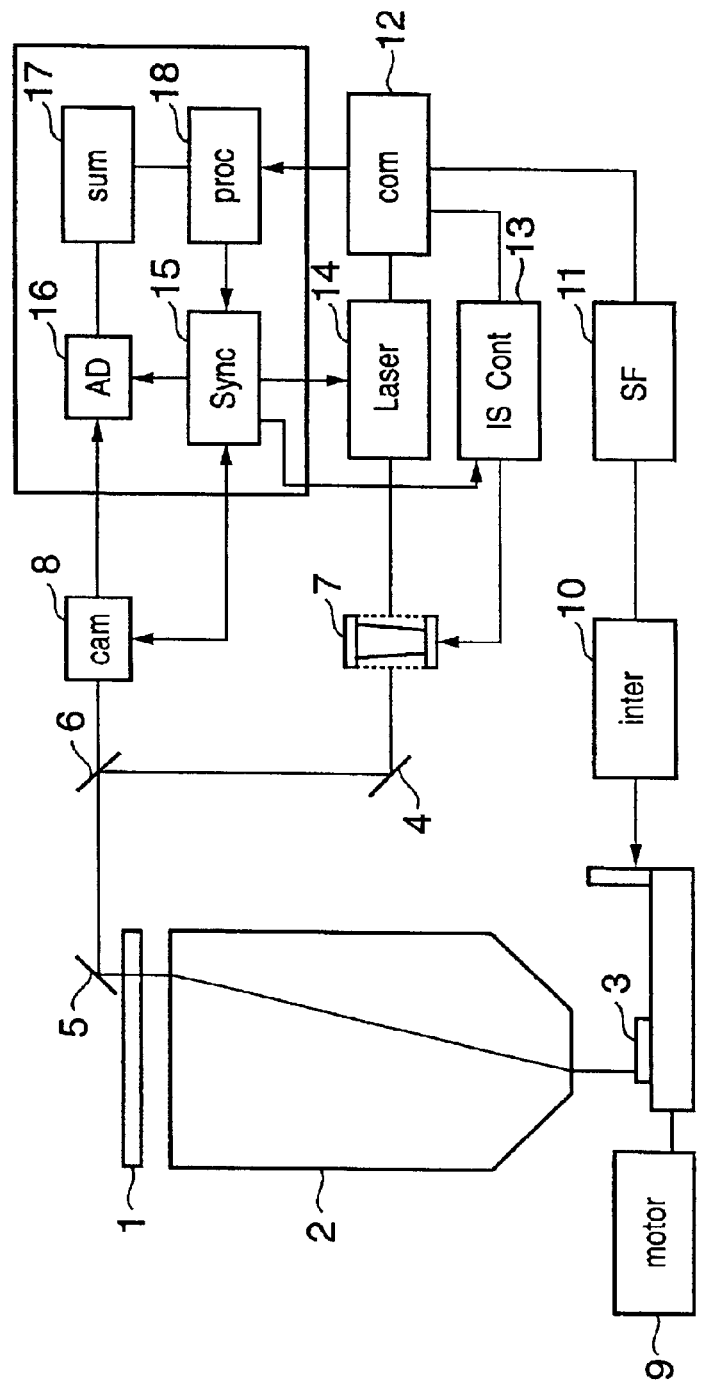
FIG. 11 is a schematic view of a configuration of a light receiving apparatus according to a conventional example.
Figure 12:
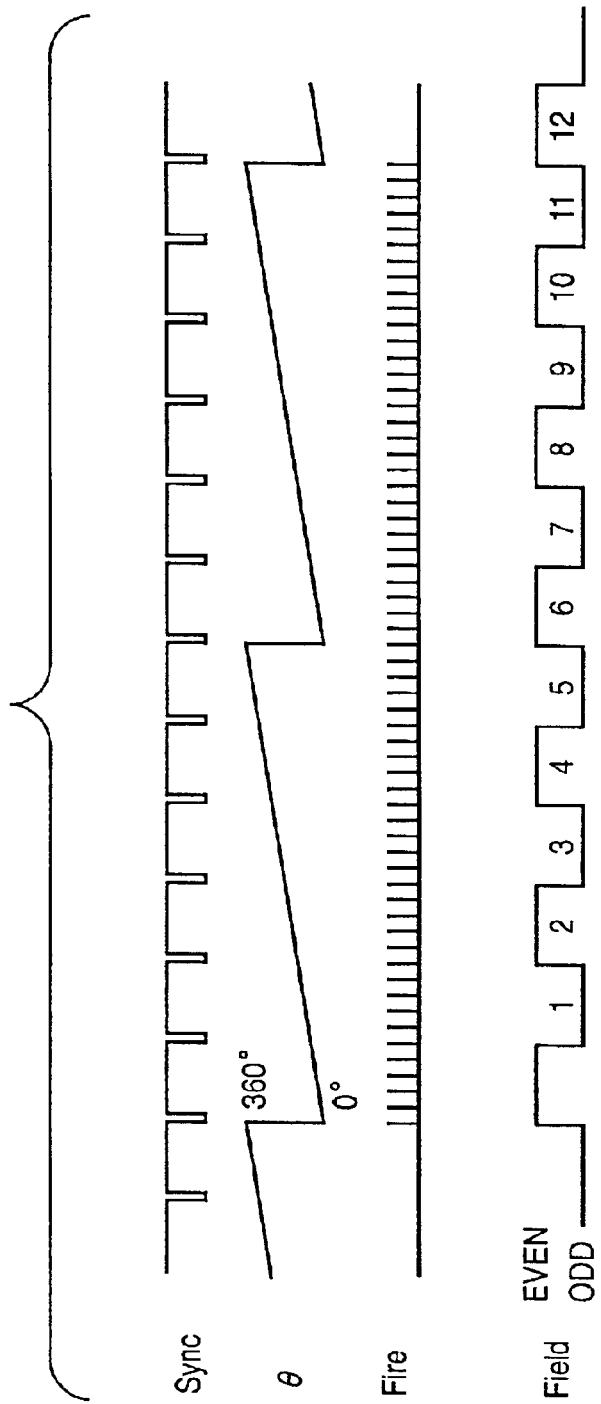
FIG. 12 is an explanatory view of timing of oscillating means, laser light emitting and image storage according to the conventional example.

FIG. 1 is a schematic view of a configuration of a light receiving apparatus and a mark detecting apparatus, which best represents features of the present invention, and which observes a mark on a reticle stage (original plate stage) and a mark on a wafer stage (substrate stage) by a TTR system and shows a case of measuring one or both of the marks. In FIG. 1, the same reference numerals as in FIG. 11 denote the same components.

Measured values include brightness, contrast (a defocusing amount) and a position of the mark. In the present invention, details on measuring methods of the brightness, contrast and position of the mark are not significant. Subject matters are an illumination method of pulse light and a light storage method in a storage-type (position) sensor intended for measuring more accurate brightness, contrast and position of the mark. For this reason, descriptions on the measuring methods of the mark will be omitted.

A pulse laser (laser) 14 which is a pulse light emitting apparatus such as an excimer laser is a gas laser enclosing KrF, ArF, $F_2$ or the like and is a light source which emits pulsed laser light. The pulse light emitted therefrom enters into an oscillating means 7. The oscillating means 7 is an optical system for circumferentially oscillating the incident beam in an output, and the circumferential oscillation of the incident beam is realized by rotating, for example, a wedge with a motor. The beam oscillated by the oscillating means 7 is reflected by a mirror 4, passes through a half mirror 6 and is reflected by a mirror 5 to reach a mark on a reticle 1 side on a reticle stage (positioning mark or contrast measuring mark). Further, the light (beam oscillated by the oscillating means 7) passes through a projection lens 2 and irradiates a reference mark (positioning mark or contrast measuring mark) of a wafer 3 on a wafer stage.

Emitted pulse light of the excimer laser has generally larger illumination non-uniformity in the beam than a continuous light such as a mercury lamp, so that exposing the beam in a fixed manner requires a plurality of pulses and cannot restrain the illumination non-uniformity within an allowable range. Thus, in this embodiment, the excimer laser 14 is emitted with the beam circumferentially oscillated by the oscillating means 7.

On the other hand, in FIG. 1, the beam reflected by the reference mark of the wafer 3 passes through the projection lens 2 and the mark on the reticle 1 side, is reflected by the mirror 5 and passes through a half mirror 6 to enter into an imaging surface of a CCD camera (cam) 8 which is a storage-type position sensor. Thus, the CCD camera 8 can simultaneously observe the mark of the wafer 3 which is the reference on the wafer stage side and the mark on the reticle 1 side, and a relative position of the wafer stage and reticle stage (mark position), brightness of each mark (an amount of light of the mark) or contrast (mark contrast) can be obtained by processing the images.

The number of rotation of the oscillating means 7 depends on a scanning speed in exposure. The number of the pulses required during storage is previously determined so as to be the sufficient number for having no influence on measuring accuracy.

From the above two parameters, that is, the number of rotation (R) of the oscillating means and the number of pulses (P) required during the storage, a storage time (CT) (of the storage-type position sensor) and laser (pulse) light emitting frequency (LF) is determined by the following equations.

R: The number of rotation of oscillating means [rpm]
Y: The number of oscillation (the number of oscillation in one rotation of oscillating means)
YS: Oscillation cycle [sec]
YT: The number of oscillating revolution (the number of revolution of the oscillating means required for capture, an integral value)
LM: MAX frequency of laser [pulse/sec]
P: The number of storage pulse
LF: Laser frequency [Hz]
CT: Storage time [sec]

$$YS \text{ (sec)} = \frac{60 \text{ (sec)}}{Y \times R \text{ (rpm)}} \qquad \text{Equation 1}$$

$$YT = \frac{P \text{ (pulse)}}{LM \text{ (Pulse/sec)} \times YS \text{ (sec)}} \text{(fractional portions are omitted)} \qquad \text{Equation 2}$$

$$LF \text{ (Hz)} = \frac{P}{YT \times YS \text{ (sec)}} \qquad \text{Equation 3}$$

$$CT \text{ (sec)} = YT \times YS \text{ (sec)} \qquad \text{Equation 4}$$

The pulse frequency of the laser is obtained by the number of rotation of the oscillating means 7 and the number of pulses stored in the CCD camera 8 to be controlled by an exposure control apparatus (com) 12. The storage time of the CCD camera 8 is obtained by the number of rotation of the oscillating means 7 and the number of pulses stored in the CCD camera 8 and is transmitted from the exposure control apparatus 12 to a control section (proc) 18 of an image processing apparatus to be set in a camera synchronizing control apparatus (Sync) 15.

Capturing the image and measuring the reticle mark and stage mark from the captured image are carried out by the following flow (steps S101 to S108). The number of rotation of the oscillating means 7 is previously instructed from the exposure control apparatus 12 to the oscillating control apparatus (IS Cont) 13, assuming that stable rotation is carried out.

Step S101: A reticle and wafer stage are positioned in a predetermined position.
Step S102: Storage time CT adjusted to frequency of the oscillating means 7 is set in a camera synchronizing control apparatus in a route of com (12), proc (18) and Sync (15).
Step S103: Laser frequency (LF) is instructed from the com (12) to Laser (14). At the same time, the number of pulses (P) of light to be emitted when externally controlled by laser is instructed from the com (12) to the laser (14) (a dummy pulse light emitting step).
Step S104: A measurement command is issued from the com (12) to the proc (18).
Step S105: A laser oscillating signal and CCD camera storage signal are generated from the camera synchronizing control device (Sync) 15 (measurement pulse light emitting step).
Step S106: Laser light emitting (emitted at the obtained frequency (LF)) and image capture (storage is started by a storage-type position sensor) are executed.
Step S107: The captured image is output as a video signal and converted from an analog signal (electrical signal) to a digital signal by an A/D converter (AD).
Step S108: The digital data is processed in a control section (proc) 18 of the image processing apparatus, and measurement of positions of the reticle mark and stage mark is carried out.

Figure 2:
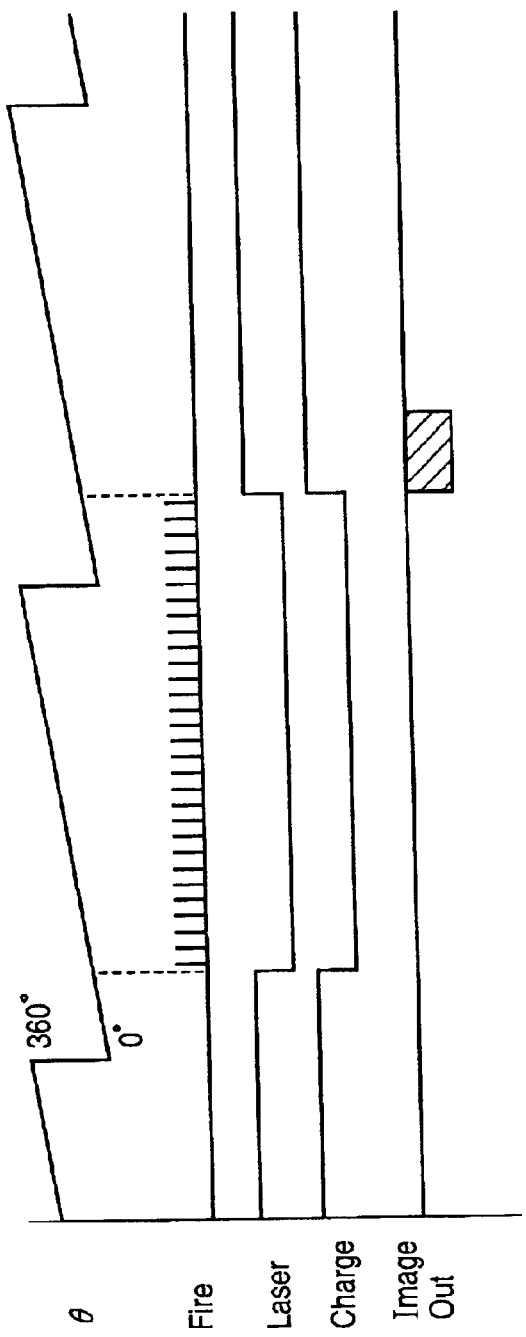
FIG. 2 is an explanatory view of timing of oscillating means, laser light emitting and image storage (storage for one cycle (one rotation of the oscillating means)) according to the present invention.

For the steps S105 and S106 in the above flow, description will be made with reference to FIG. 2. FIG. 2 is an explanatory view of timing of oscillation by oscillating means, laser light emitting and image storage according to this embodiment. An example is shown when carrying out the laser light emitting (Laser) and CCD storage (Charge) in one rotation of the oscillating means 7 as one cycle. A camera to be used is an all picture elements capture camera (a non-interlace-type CCD camera which can control the storage time).

The light emitting frequency of the laser depends on the number of rotation (frequency) of the oscillating means and the number of required pulses (P). A picture signal is output after storage in accordance with a normal using manner of the CCD camera.

The laser light emitting frequency for emitting light of the required number of pulses for one cycle of the oscillating means 7 and the storage time are determined by Equation 3. In FIG. 2, light emitting of the laser of required number of times at (laser light emitting pulse) frequency shown by "Fire" just corresponds to one cycle of the oscillation. The light emitting control signal (Charge) of the laser (Laser) and the storage control signal of the CCD camera are generated at the same timing.

Since there is no need for synchronizing starting points of oscillation (θ) of the oscillating means, the laser light emitting (Fire) and the CCD capture (Charge), laser oscillation may be started asynchronously as shown in FIG. 2. Thus, the starting point 0° of the oscillating means and the starting point of the laser light emitting and the CDD capture are asynchronous.

If being aware of occurrence of some delay of the laser light emitting start, it is possible, allowing for the delay, to extend the time as a margin by the delay of an end of the CCD capture (the storage time ends later than the pulse light emitting end) (the storage time of the storage-type position sensor may be started earlier than the pulse light emitting start). Even if the storage time becomes somewhat long, unnecessary light does not enter during the term, which has no influence on measurement.

In FIG. 2, one cycle of the oscillating means 7 is shown, however, when the oscillation frequency is high, a shortage may occur of the number of light emitting pulses in one cycle of the oscillating means depending on the capacity of maximum frequency of the laser emission. In such a case, pulsing may be continued during two cycles as storage for two cycles (two rotations). Of course, when still more number of pulses are required, the cycles are increased as three, four or five, and also in these cases, pulsing may be continued during corresponding cycles.

Figure 3:
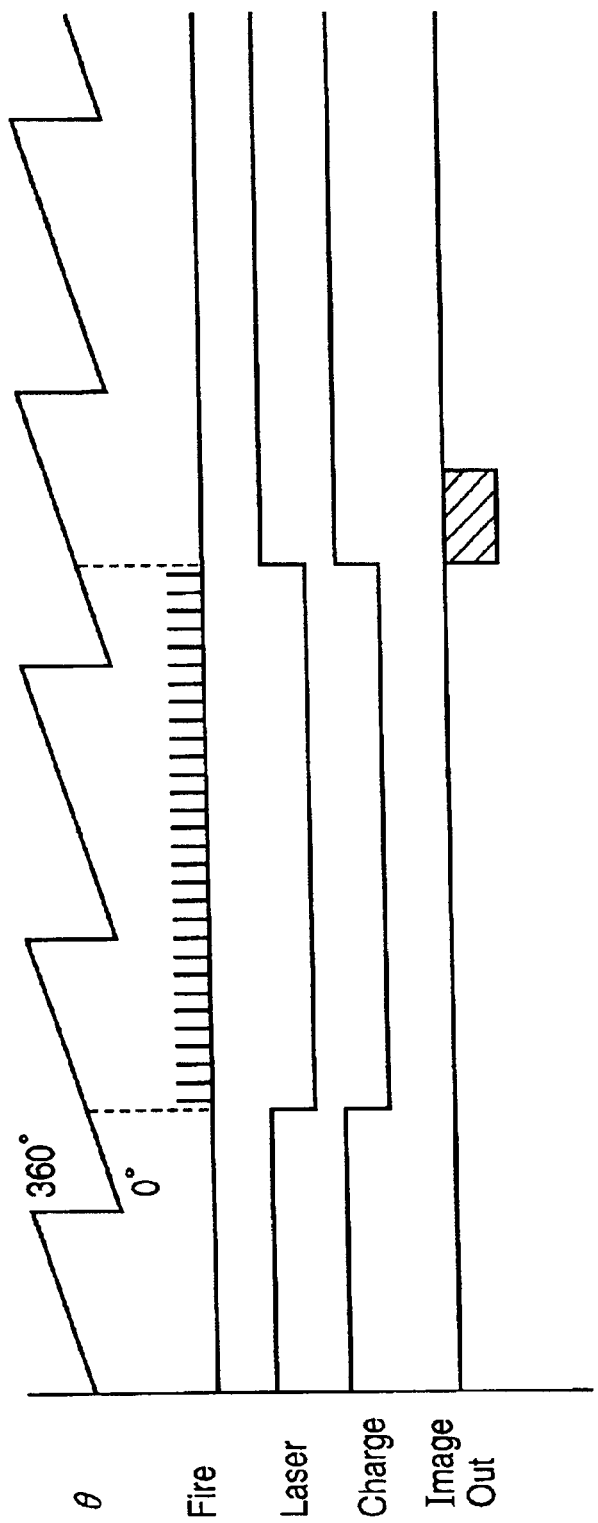
FIG. 3 is an explanatory view of timing of the oscillating means, laser light emitting and image storage (storage for two cycles (two rotations of the oscillating means))

FIG. 3 shows an example of storage for two cycles of the oscillating means. With Equations 1 to 4, the required number of oscillation cycles can be determined. In this case, there is no need for synchronizing the starting points of the oscillation (θ) of the oscillating means, laser light emitting (Fire) and CCD capture (Charge), so that laser oscillation may be started asynchronously as shown in FIG. 3. Thus, the starting point 0° of the oscillating means and the starting points of the laser light emitting and CCD capture are asynchronous.

In this embodiment, the description was made on the CCD camera as an example. However, not only the two-dimensional camera but also the various kinds of sensors such as an array sensor, one-dimensional CCD and photo sensor can be applied if they are sensors capable of storing light.

Further, the present invention may be applied to not only a semiconductor producing apparatus (such as an exposing apparatus) but also an apparatus using a similar illumination mechanism or a light storage sensor, for example, a test apparatus.

As described above, according to this embodiment, a stable image with high accuracy can be always generated on a storage type position sensor without changing oscillation frequency of oscillating means, and further, synchronizing is unnecessary for control of the oscillating means, and the image can be generated asynchronously.

The present invention permits stabilization and increased accuracy of measurement, and reduction of measurement time. Accordingly, in manufacturing a device such as a semiconductor, the present invention contributes to improvement of productivity by improvement of throughput, and improvement of an yield by the increased accuracy of measurement.

[Second Embodiment]

Figure 4:
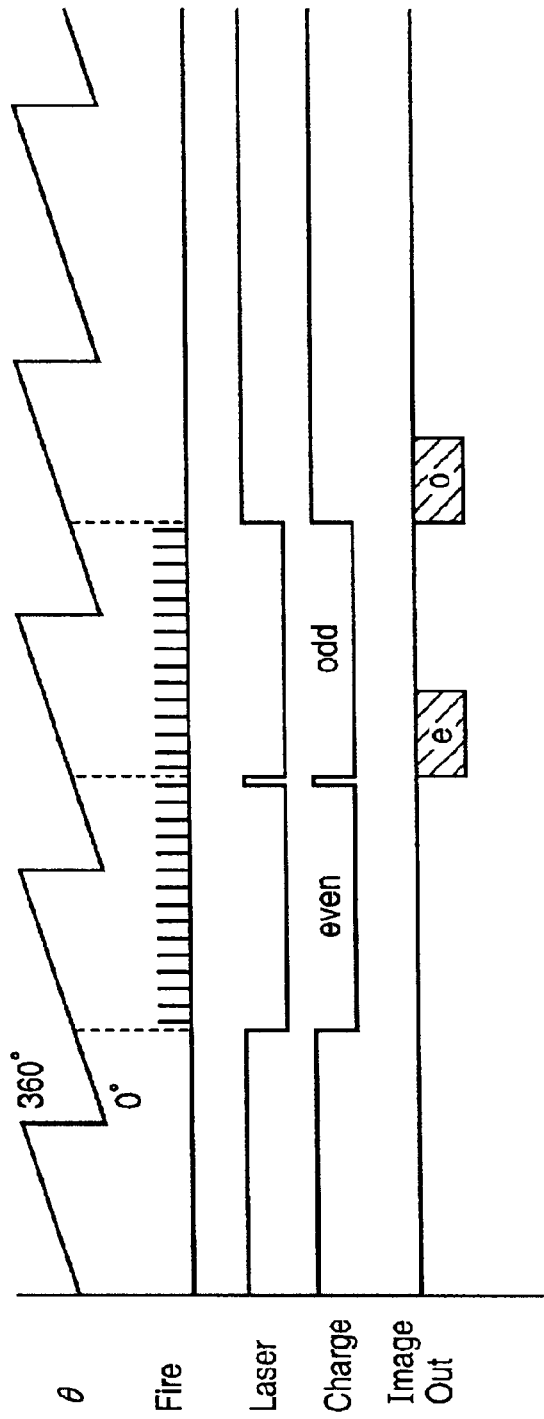
FIG. 4 is an explanatory view of timing of the oscillating means, laser light emitting and image storage when carrying out light storage with an imaging area time divided between even/odd fields according to the present invention.

In the first embodiment, the capture by a non-interlace camera was described. In the second embodiment, there is shown a capturing method in the case of an interlace-type CCD camera which stores light by time dividing an imaging area as an interlace camera which makes a division between even/odd areas as shown in FIG. 4 (which can control even/odd storage time).

The storage time can be considered in the same way as described in the first embodiment in terms of the even/odd storage time. With oscillation frequency and the number of pulses to be stored in each of even/odd fields, laser light emitting frequency and the storage time are calculated to start the capture (the storage time can be controlled).

In this case, the even/odd storage time is not used in a fixed condition of 1/60 [sec] such as in an NTSC system. The storage time is variable. For a picture signal, the image of the even field after even storage and the image of the odd field after odd storage are respectively output. However, positions of imaged target objects are not stored at the same time, which causes somewhat lower accuracy in measurement when the purpose is the mark position measurement. In such a case, errors can be cancelled by measuring displacement in the even/odd storage time of an equipped interferometer (inter) concurrently with the storage and utilizing the displacement.

As described above, according to this embodiment, a stable image with high accuracy can be always generated in a storage type position sensor without changing oscillation frequency of oscillating means, and further, synchronizing is unnecessary for control of the oscillating means, and the image can be generated asynchronously.

[Third Embodiment]

In this embodiment, a capturing method which cancels transitional change of energy immediately after a pulse laser light emitting start. The laser (pulse light) and storage are controlled so as not to store light of a primary few pulses which is likely to generate transitional changes.

Figure 5:
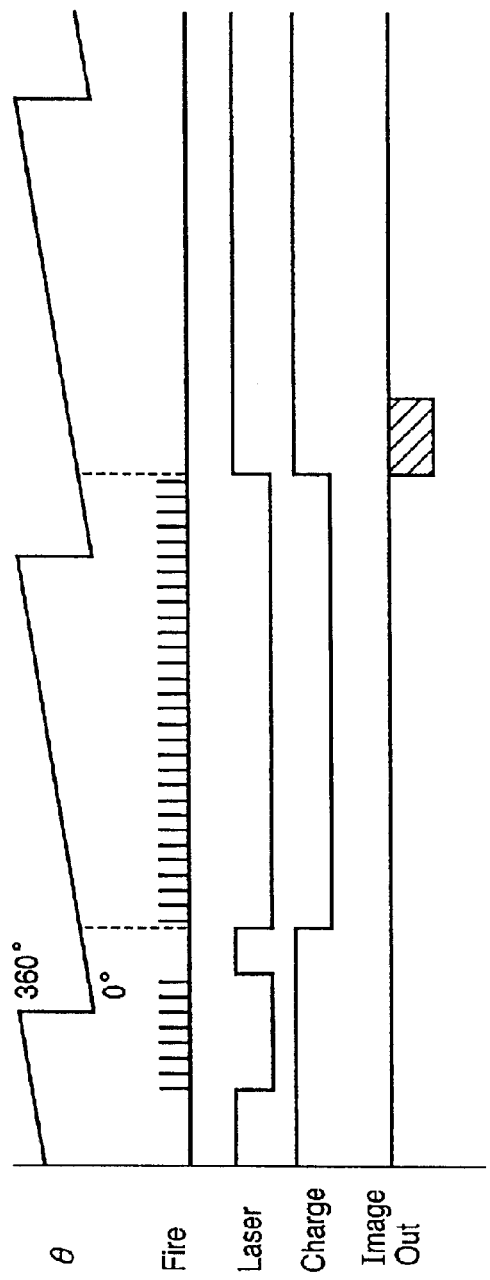
FIG. 5 is an explanatory view of timing of the oscillating means, laser light emitting and image storage when not storing light at a laser light emitting start according to the present invention.

In the first embodiment, used as a laser light emitting control signal is the same as a CCD storage control signal (S5 in the first embodiment). In order not to store the light at the laser light emitting start, the laser control signal (Laser) and the CCD storage control signal (Charge) are independently controlled as shown in FIG. 5. First, laser light of a few pulses is emitted (Fire) to wait stabilization of laser energy. When the laser energy is stabilized, laser light of required pulses is emitted to start CCD storage.

This allows the light with the same energy only to be always stored, which permits extremely stable measurement.

[Embodiment in a Semiconductor Production System]

Next, an example of a production system of devices such as a semiconductor using the exposing apparatus described above (a semiconductor chip such as IC or LSI, liquid crystal panel, CCD, thin film magnetic head, micromachine or the like). This system is such that dealing with trouble or regular maintenance of a manufacturing apparatus located in a semiconductor manufacturing plant or maintenance service such as providing software are carried out using a computer network or the like outside the manufacturing plant.

Figure 6:
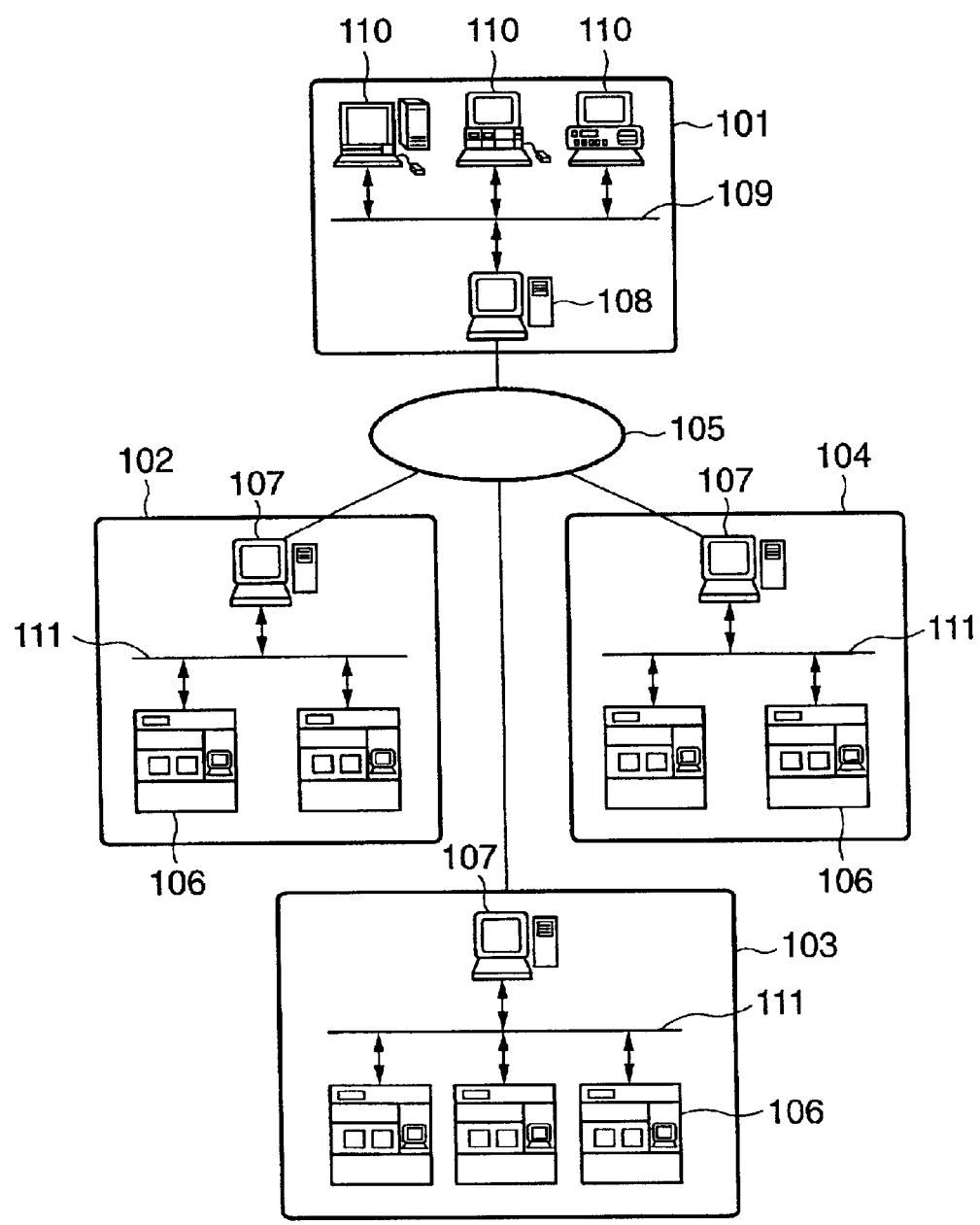
FIG. 6 is a view of a concept of a production system of a semiconductor device including an exposing apparatus according to the present invention seen from a certain angle.

FIG. 6 represents a whole system cut from a certain angle. In the figure, reference numeral 101 denotes a business place of a vendor (apparatus provider) which provides the manufacturing apparatus of the semiconductor devices. Assuming as examples of the manufacturing apparatuses are semiconductor manufacturing apparatuses for various processes used in the semiconductor manufacturing plant, for example, an apparatus for pre-processes (such as an exposing apparatus, resist processing apparatus, lithography apparatus such as an etching apparatus, heat treatment apparatus, film making apparatus or planarizing apparatus) or apparatus for post-processes (such as an assembling apparatus or test apparatus). Provided in the business place 101 are a host management system 108 which provides maintenance database of the manufacturing apparatus, a plurality of operation terminal computer 110 and a local area network (LAN) 109 which combines them to construct an intranet or the like. The host management system 108 includes a gateway for connecting the LAN 109 to the Internet 105 which is an external network outside the business place and a security facility for limiting external access.

Reference numerals 102 to 104 denote manufacturing plants of semiconductor manufacturers as users of the manufacturing apparatuses. The manufacturing plants 102 to 104 may belong to respectively different manufacturers or belong to the same manufacturer (for example, a pre-process plant and a post-process plant). Provided in each of the plants 102 to 104 is a plurality of manufacturing apparatuses 106, a local area network (LAN) 111 which combines them to construct an intranet or the like and a host management system 107 as a monitoring apparatus for monitoring operating condition of each manufacturing apparatus 106. The host management system 107 provided in each of the plants 102 to 104 includes a gateway for connecting the LAN 111 with the Internet 105 which is the external network of the plant. This permits access to the host management system 108 on the vendor 101 side from the LAN 111 of each plant via the Internet 105, and a security facility of the host management system 108 allows limited users to have access. Specifically, notification of status information showing the operating condition of each manufacturing apparatus 106 (for example, symptom of the manufacturing apparatus having trouble) is sent from the plant to the vendor via the Internet 105, and also response information to the notification (for example, information on instruction of remedy for the trouble, or software or data for dealing with them), latest software, maintenance information such as help information can be received from the vendor. For data communication between each of the plants 102 to 104 and the vendor 101 and data communication on the LAN 111 in each plant, a communication protocol (TCP/IP) is used which is generally used in the Internet. Instead of using the Internet as the external network outside the plant, a dedicated line network (such as ISDN) to which a third person cannot have access and which has high security may be used.

The host management system is not limited to that provided by the vendor, but the user may construct database to be located on the external network so that a plurality of the user plants are allowed to have access to the database.

Figure 7:
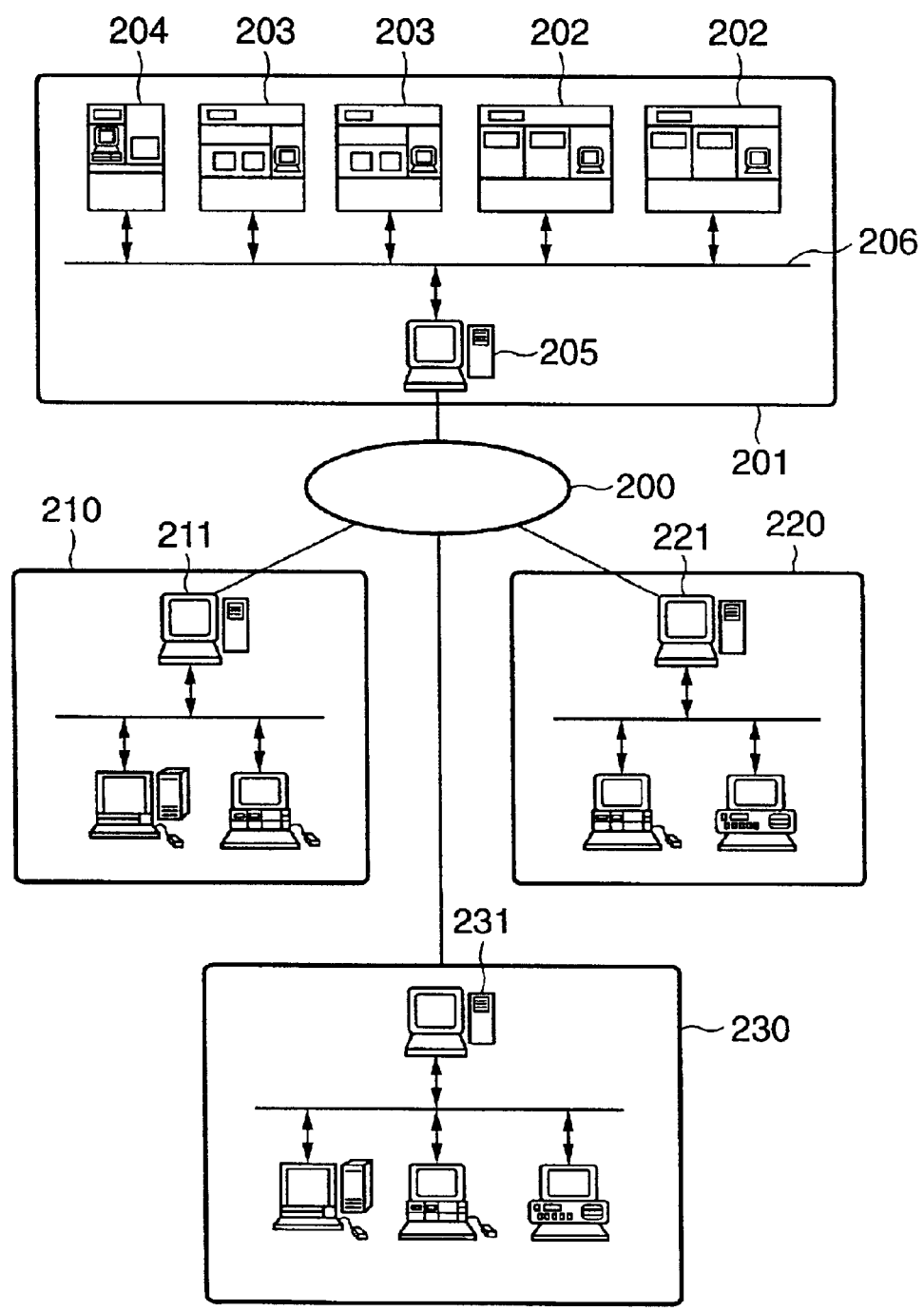
FIG. 7 is a view of a concept of the production system of the semiconductor device including the exposing apparatus according to the present invention seen from a different angle.

FIG. 7 is a view of a concept which represents the whole system of this embodiment cut from a different angle from FIG. 6. In the former example, the plurality of user plants each of which has the manufacturing apparatus and the management system of the vendor of the manufacturing apparatus are connected via the external network to carry out the data communication of information on production management or on at least one manufacturing apparatus via the external network. In this example, on the other hand, a plant provided with the manufacturing apparatuses of a plurality of vendors and the management system of each vendor of the plurality of apparatus are connected via the external network outside the plant to carry out data communication of maintenance information of each manufacturing apparatus. In the figure, reference numeral 201 denotes a manufacturing plant of the manufacturing apparatus user (semiconductor device manufacturer), and introduced in a manufacturing line of the plant are manufacturing apparatuses carrying out various processes, for example here, an exposing apparatus 202, resist processing apparatus 203 and film making processing apparatus 204. In FIG. 7, only one manufacturing plant 201 is shown, but actually a plurality of plants are similarly networked. The apparatuses in the plant are connected via a LAN 206 to form an intranet or the like to carry out operation management of the manufacturing line by a host management system 205. Business places of the vendors (apparatus providers) such as an exposing apparatus manufacturer 210, resist processing apparatus manufacturer 220 and film making apparatus manufacturer 230 respectively have host management systems 211, 221, 231 for remote maintenance of the provided apparatuses, which have the gateways of the maintenance database and external network as described above. The host management system 205 for managing each apparatus in the manufacturing plant of the user and the management systems 211, 221, 231 of the vendor of the apparatus are connected via the Internet or dedicated line network which is an external network 200. In this system, operation of the manufacturing line is stopped when trouble occurs with any one of a series of manufacturing apparatus in the manufacturing line, but the remote maintenance via the Internet 200 from the vendor of the apparatus having trouble permits rapidly dealing with the trouble and minimizing stop of the manufacturing line.

Each manufacturing apparatus located in the semiconductor manufacturing plant has a display, network interface and computer which executes software for network access and software for apparatus operation stored in a storage unit. The storage unit includes an internal memory, hard disk, network file server or the like. The software for the network access includes dedicated or general-purpose web browser, and for example, a user interface of a screen shown in FIG. 8 as an example is provided on the display. An operator who manages the manufacturing apparatus in each plant inputs information on a model 401, serial number 402, subject of the trouble 403, date of occurrence 404, urgency 405, symptom 406, remedy 407, progress 408, or the like on input items on the screen. The input information is transmitted to the maintenance database via the Internet and the resultant appropriate maintenance information are returned from the maintenance database and presented on the display. The user interface provided by the web browser realizes hyperlink facility 410, 411, 412 as shown, and the operator can have access to more detailed information of each item, extract software of the latest version to be used in the manufacturing apparatus from a software library provided by the vendor, or extract operation guide (help information) served as references for the operator in the plant. The maintenance information provided by the maintenance database includes information on the present invention described above, and the software library also provide the latest software for realizing the present invention.

Figure 9:
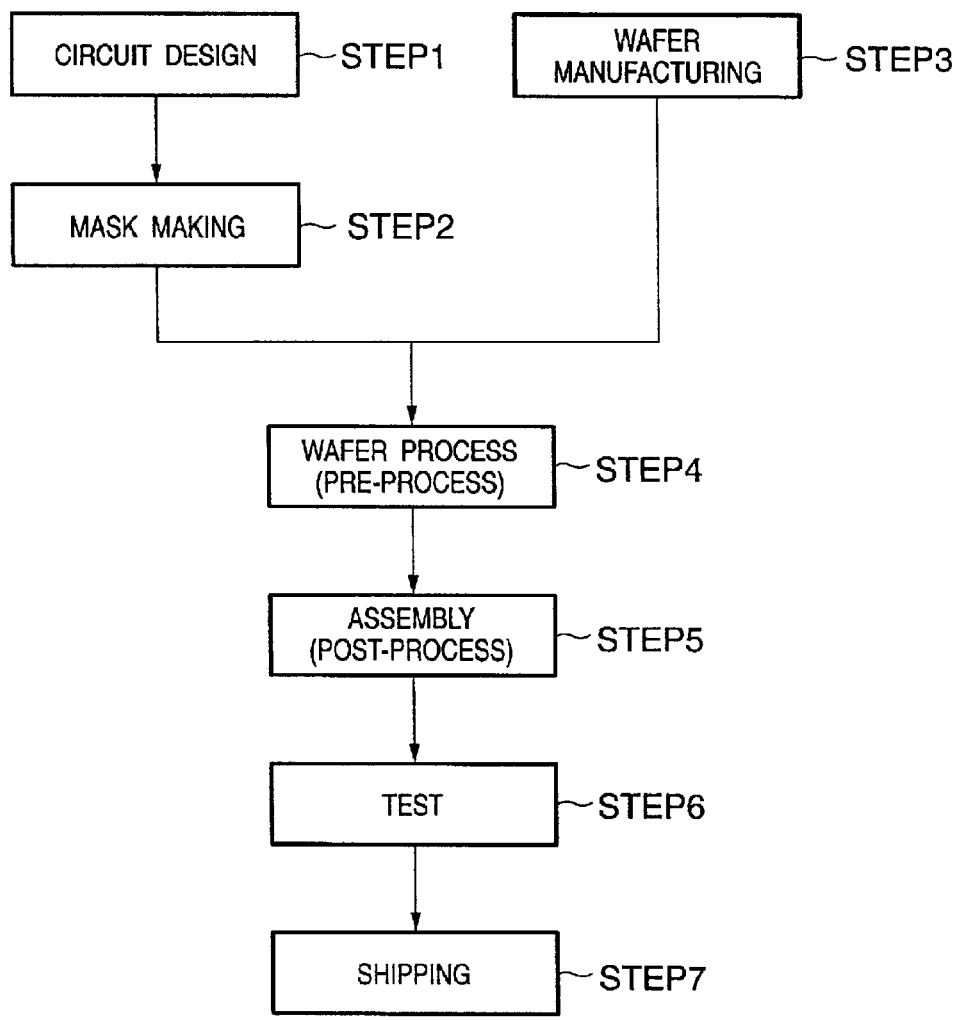
FIG. 9 is an explanatory view of a flow of a manufacturing process of the device by the exposing apparatus according to the present invention.

Next, a manufacturing process of the semiconductor device utilizing the above described production system. FIG. 9 shows a flow of the whole manufacturing process of the semiconductor device. In a step S1 (circuit design), a circuit of the semiconductor device is designed. In a step S2 (mask making), a mask is made which is formed with the designed circuit pattern. In a step S3 (wafer manufacturing), a wafer is manufactured with materials such as silicone. A step S4 (wafer process) is called pre-process, where the actual circuit is formed on the wafer by a lithographic technique using the prepared mask and wafer. A nest step S5 (assembling) is called post-process, where a semiconductor chip is produced using the wafer made in the step S4 and which includes an assembling process such as an assembly processes (dicing, bonding) or a packaging process (chip enclosing). In a step S6 (test), tests such as an operation confirming test and a durability test are carried out of the semiconductor device made in the step S5. Via these processes, the semiconductor device is completed and shipped (step S7). The pre-process and post-process are respectively carried out in different plants respectively dedicated, and maintenance is carried out by the remote maintenance system described above for each plant. Between the pre-process plant and post-process plant, the data communication of information on the production management or maintenance of the apparatus is also carried out via the Internet or dedicated line network.

Figure 10:
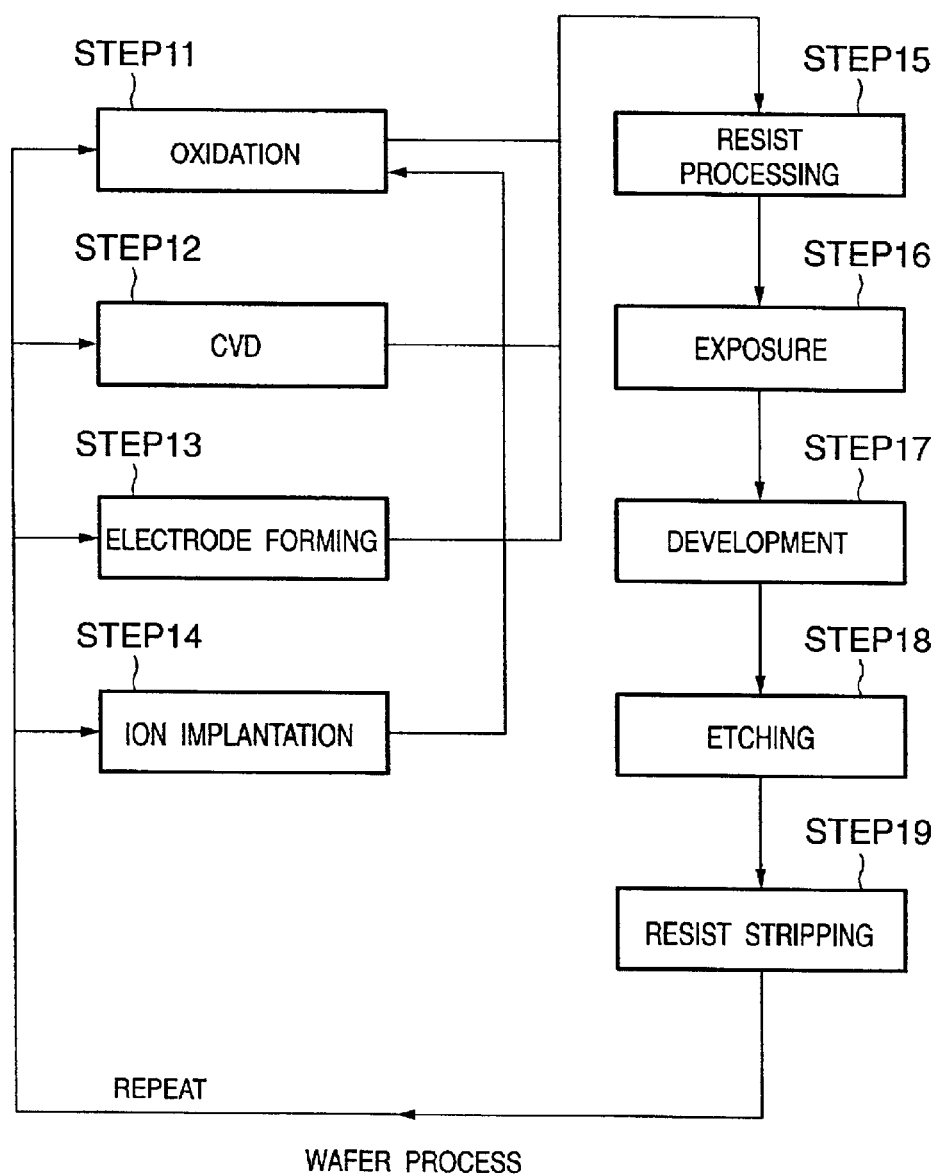
FIG. 10 is an explanatory view of a wafer process by the exposing apparatus according to the present invention.

FIG. 10 shows a detailed flow of the wafer process. In a step S11 (oxidation), a surface of the wafer is oxidized. In a step S12 (CVD), an insulating film is formed on the surface of the wafer. In a step S13 (electrode forming), electrodes are formed on the wafer by vapor deposition. In a step S14 (ion implantation), ion is implanted in the wafer. In a step S15 (resist processing), sensitive material is applied on the wafer. In a step S16 (exposure), the circuit pattern of the mask is exposed to be printed on the wafer by the exposing apparatus described above. In a step S17 (development), the exposed wafer is developed. In a step S18 (etching), parts other than a developed resist image are etched away. In a step S19 (resist stripping), unnecessary resist after etching are stripped. By repeating these steps, the circuit patterns are formed on the wafer in a multiple manner. The manufacturing apparatus used in each process is maintained by the remote maintenance system described above, so that trouble can be prevented, and rapid recovery is possible if trouble occurs, thus permitting improvement of productivity of semiconductor devices compared to conventional examples.

As described above, according to the present invention, a stable image with high accuracy can be always generated by a storage type position sensor without changing oscillation frequency of oscillating means. Further, for control, asynchronous image generating is possible without synchronizing with the oscillating means. The control system is not complicated.

Obtained effects are stabilization and increased accuracy of measurement, and reduction of measurement time. Accordingly, in manufacturing a device such as a semiconductor, the present invention contributes to improvement of productivity by improvement of throughput, and improvement of an yield by the increased accuracy of measurement.

As many apparently widely different embodiments of the present invention can be made without departing from the spirit and scope thereof, it is to be understood that the invention is not limited to the specific embodiments thereof except as defined in the claims.

What is claimed is:

1. A light receiving apparatus for uniforming pulse light emitted from a pulse light emitting apparatus by oscillating means and receiving the light by a storage-type position sensor, comprising means for obtaining pulse light emitting frequency of said pulse light emitting apparatus from a cycle of said oscillating means and predetermined number of pulses of said pulse light to start storage by said storage-type position sensor and emit said pulse light from said pulse light emitting apparatus by the obtained pulse light emitting frequency.

2. The light receiving apparatus according to claim 1, wherein said storage-type position sensor uses a non-interlace type CCD camera which can control the storage time when the light is received by the storage-type position sensor.

3. The light receiving apparatus according to claim 1, wherein said storage-type position sensor uses an interlace type CCD camera which can control even/odd storage time when the light is received by the storage-type position sensor.

4. The light receiving apparatus according to claim 1, wherein said storage time when the light is received by the storage-type position sensor starts earlier than a pulse light emitting start and ends later than a pulse light emitting end.

5. The light receiving apparatus according to claim 1, wherein said pulse light emitting apparatus uses an excimer laser.

6. The light receiving apparatus according to claim 1, wherein said pulse light emitting apparatus is controlled by two steps of a dummy pulse light emitting step and a measurement pulse light emitting step, and data storage by said storage-type position sensor is not carried out by the dummy pulse light emitting, but by said measurement pulse light emitting, the storage time of said storage-type position sensor and said pulse light emitting frequency are obtained from the cycle of the oscillating means and the predetermined number of pulses to start the storage by said storage-type position sensor and emit said pulse light from the pulse light emitting apparatus by the obtained pulse light emitting frequency.

7. The light receiving apparatus according to claim 1, wherein the storage start of said storage-type position sensor and the pulse light emitting from said pulse light emitting apparatus by the obtained pulse light emitting frequency are carried out simultaneously.

8. The light receiving apparatus according to claim 1, wherein the oscillating cycle of the oscillating means is adjusted to said pulse light emitting frequency by adjusting the oscillation frequency of said oscillating means to the storage time of said storage-type position sensor, and there is no need for adjusting said oscillating means to an image capture cycle by said light receiving apparatus.

9. The light receiving apparatus according to claim 1, wherein there is no need for adjusting said oscillating means to measurement, permitting use of the oscillation frequency of said oscillating means in exposure.

10. The light receiving apparatus according to claim 1, wherein there is no need for synchronizing a staring point of said oscillating means with the storage start of said storage-type position sensor, controlling the storage time of the storage-type position sensor corresponding to an amount of said pulse light required for the measurement.

11. The light receiving apparatus according to claim 1, wherein said pulse light of a few pulses is first emitted to wait stabilization of energy of the pulse light and then start the storage by said storage-type position sensor for emitting light of required pulses.

12. The light receiving apparatus according to claim 1, wherein the storage time when the light is received by said storage-type position sensor is obtained from the cycle of said oscillating means and predetermined number of pulses of said pulse light to control the storage-type position sensor based on the storage time.

13. The light receiving apparatus according to claim 1, wherein the cycle (YS) of said oscillating means is obtained from the number of rotation (R) of the oscillating means and the number of oscillation (Y) by Equation 1, the number of oscillating revolution (YT) of said oscillating means is obtained from the cycle (YS) obtained by Equation 1, the number of pulses (P) of the oscillating means and maximum frequency (LM) of the pulse light emitted from said pulse light emitting apparatus by Equation 2, laser frequency (LF) is obtained from the number of oscillating revolution (YT) obtained by Equation 2, the cycle (YS) of said oscillating means obtained by Equation 1 and the number of pulses (P) of the oscillating means by Equation 3, and the storage time of said storage-type position sensor is obtained from the oscillation cycle (YS) obtained by Equation 1 and the number of oscillating revolution (YT) obtained by Equation 2 by Equation 4, Equations 1 to 4 being formulated by the following relational expression.

* * * * *

UNITED STATES PATENT AND TRADEMARK OFFICE
CERTIFICATE OF CORRECTION

PATENT NO. : 6,788,390 B2
DATED : September 7, 2004
INVENTOR(S) : Hiroshi Tanaka It is certified that error appears in the above-identified patent and that said Letters Patent is hereby corrected as shown below:

Column 2,
Line 7, "an image" should be deleted.
Line 63, "according" should read -- accordance --.

Column 3,
Line 1, "second" should read -- seconds --.

Column 5,
Line 1, "emitting, but" should read -- emitting step, but --.
Line 2, "emitting, the" should read -- emitting step, the --.
Line 27, "staring" should read -- starting --.
Line 34, "wait" should read -- await --.

Column 7,
Line 35, "light" should read -- lights --.

Column 11,
Line 20, "CDD capture" should read -- CCD capture --.

Column 12,
Line 5, "an" should read -- a --.
Line 40, "embodiment, a" should read -- embodiment is a --.
Line 58, "Next, an" should read -- Next is an --.

Column 13,
Line 16, "computer" should read -- computers --.

Column 14,
Lines 4 and 32, "apparatus" should read -- apparatuses --.
Line 51, "are" should read -- is --.
Line 62, "provide" should read -- provides --.
Line 64, "Next, a" should read -- Next is a --.

Column 15,
Line 10, the second occurrence of "an" should be deleted.
Line 13, "of" should read -- on --.
Line 37, the first occurrence of "are" should read -- is --.
Line 56, "an" should read -- a --.

UNITED STATES PATENT AND TRADEMARK OFFICE
CERTIFICATE OF CORRECTION

PATENT NO.    : 6,788,390 B2
DATED         : September 7, 2004
INVENTOR(S)   : Hiroshi Tanaka It is certified that error appears in the above-identified patent and that said Letters Patent is hereby corrected as shown below:

Column 16,
Line 29, "emitting, but" should read -- emitting step, but --.
Line 30, "emitting, the" should read -- emitting step, the --.
Line 54, "staring" should read -- starting --.
Line 61, "wait" should read -- await --.

Column 18,
Line 6, "storage time" should read -- storage time (CT) --.
Line 18, "rational expression." should read -- rational expressions:

$$YS\,(\text{sec}) = \frac{60\,(\text{sec})}{Y \times R\,(\text{rpm})} \qquad \text{Equation 1}$$

$$YT = \frac{P\,(\text{pulse})}{LM\,(\text{Pulse/sec}) \times YS\,(\text{sec})} \quad (\text{fractional portions are omitted}) \qquad \text{Equation 2}$$

$$LF\,(\text{Hz}) = \frac{P}{YT \times YS\,(\text{sec})} \qquad \text{Equation 3}$$

$$CT\,(\text{sec}) = YT \times YS\,(\text{sec}) \qquad \text{Equation 4. --}$$

Signed and Sealed this

Fifth Day of April, 2005

JON W. DUDAS
*Director of the United States Patent and Trademark Office*